United States Patent
Chang et al.

(10) Patent No.: US 8,894,869 B2
(45) Date of Patent: Nov. 25, 2014

(54) LITHOGRAPHY PROCESS USING DIRECTED SELF ASSEMBLY

(71) Applicant: Taiwan Semiconductor Manufacturing Company, Ltd., Hsin-Chu (TW)

(72) Inventors: Yu-Sheng Chang, Taipei (TW); Tsung-Jung Tsai, Taipei (TW); Chung-Ju Lee, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 13/675,706

(22) Filed: Nov. 13, 2012

(65) Prior Publication Data

US 2014/0131312 A1 May 15, 2014

(51) Int. Cl.
*B44C 1/22* (2006.01)
*C03C 15/00* (2006.01)
*C03C 25/68* (2006.01)
*C23F 1/00* (2006.01)

(52) U.S. Cl.
CPC ..................................... *B44C 1/227* (2013.01)
USPC .................................................. 216/49; 216/41

(58) Field of Classification Search
CPC ............ H01L 21/0337; H01L 21/0338; H01L 21/0332; H01L 21/3081; H01L 21/3086; H01L 21/3088; B82Y 40/00; B81C 1/00031; B81C 2201/0149
USPC ..................................................... 216/49, 41
See application file for complete search history.

(56) References Cited

U.S. PATENT DOCUMENTS

| 7,300,883 B2 * | 11/2007 | Celii et al. ..................... 438/736 |
| 2009/0092803 A1 | 4/2009 | Bita et al. |
| 2010/0190114 A1 * | 7/2010 | Sandhu et al. ................ 430/323 |

* cited by examiner

*Primary Examiner* — Roberts Culbert
(74) *Attorney, Agent, or Firm* — Slater & Matsil, LLP

(57) ABSTRACT

A method includes forming a patterned hard mask layer, with a trench formed in the patterned hard mask layer. A Bulk Co-Polymer (BCP) coating is dispensed in the trench, wherein the BCP coating includes Poly-Styrele (PS) and Poly Methyl Metha Crylate (PMMA). An annealing is performed on the BCP coating to form a plurality of PS strips and a plurality of PMMA strips allocated in an alternating layout. The PMMA strips are selectively etched, with the PS strips left in the trench.

20 Claims, 9 Drawing Sheets

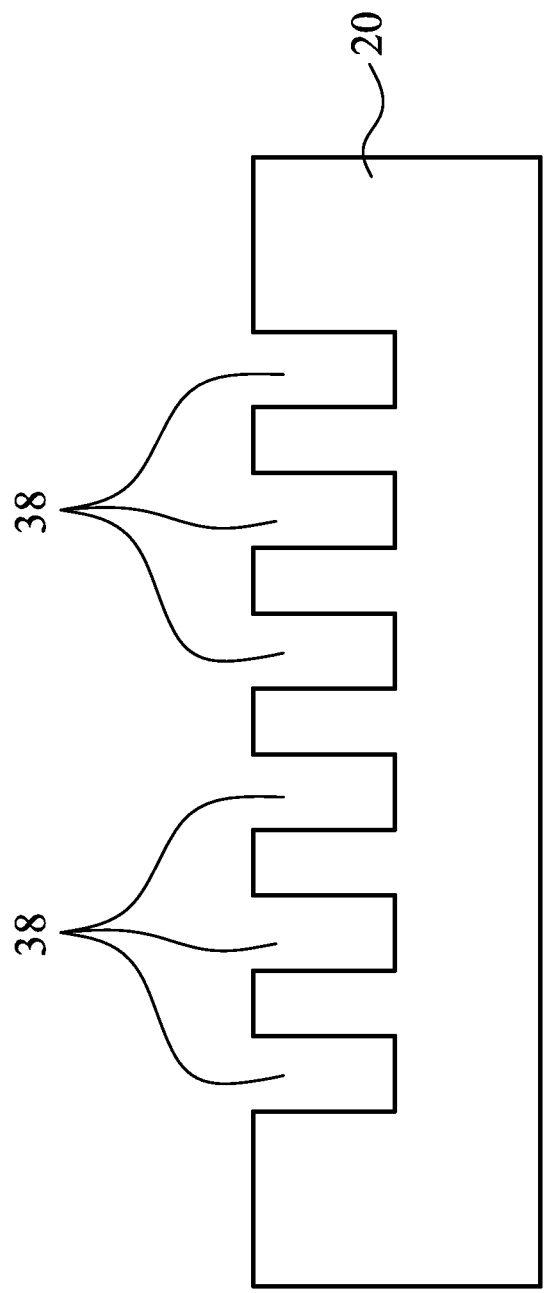

LITHOGRAPHY PROCESS USING DIRECTED SELF ASSEMBLY

BACKGROUND

Directed Self Assembly (DSA) process is currently being developed for lithography processes. In conventional DSA processes, a photo resist is formed and patterned, followed by the dispensing of a Bulk Co-Polymer (BCP) coating. The BCP coating comprises Poly-Styrele (PS) and Poly Methyl Metha Crylate (PMMA). An anneal step is then performed to cause a phase separation in the BCP, so that the PS and PMMA are separated into parallel strips that are parallel to the edges of the photo resist. The PMMA strips are then etched, and the PS strips remain. The PS strips are used as an etching mask to etch an underlying layer.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9 are cross-sectional views of intermediate stages in a Directed Self Assembly (DSA) process in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A lithography process performed using a Directed Self Assembly (DSA) process is provided in accordance with various exemplary embodiments. The intermediate stages of the lithograph process are illustrated. The variations of the embodiments are discussed. Throughout the various views and illustrative embodiments, like reference numbers are used to designate like elements.

Figure 1:
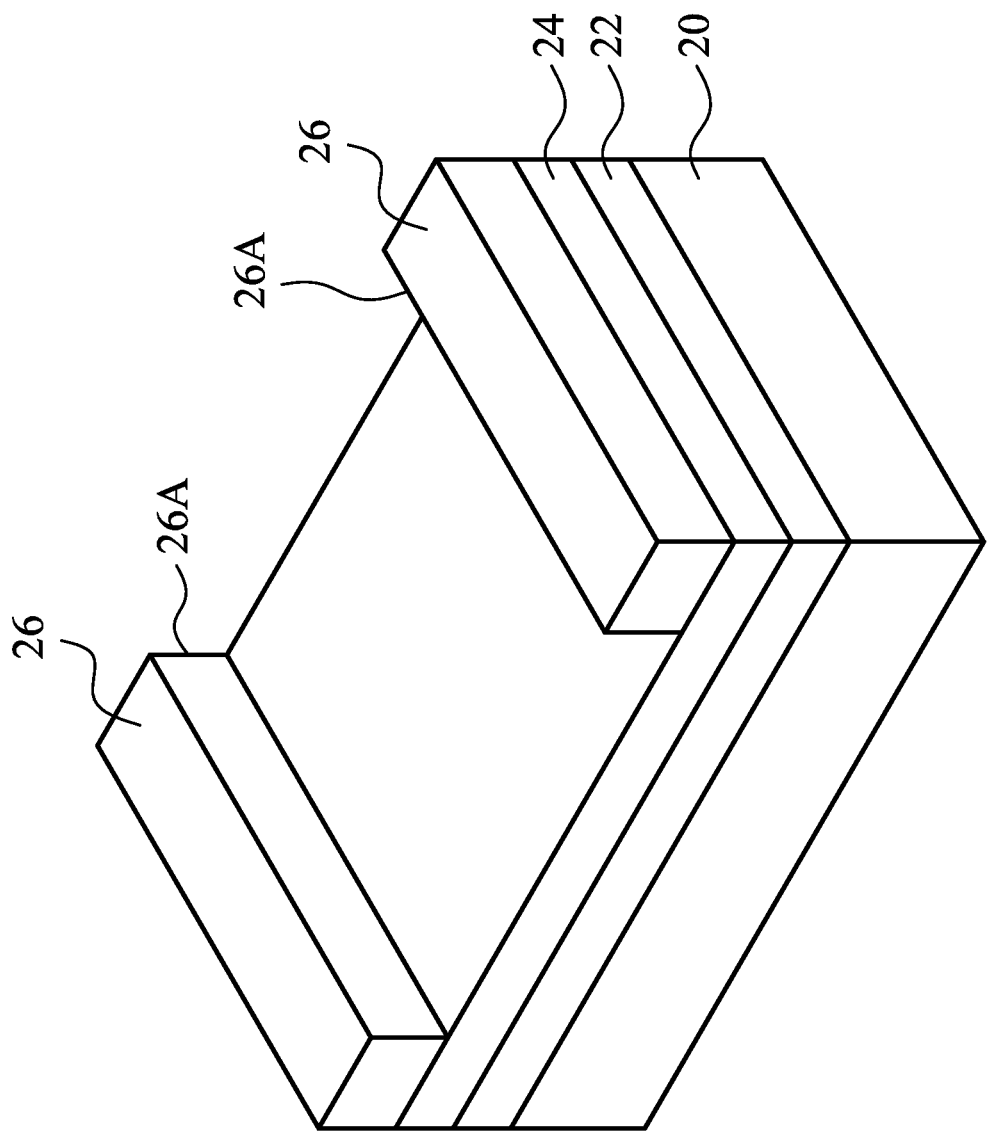

FIGS. 1 through 9 illustrate the top views and cross-sectional views of the lithography process in accordance with exemplary embodiments. FIG. 1 illustrates layer 20, which is to be patterned in the lithography process. Layer 20 may be any layer that is to be patterned in the manufacturing of integrated circuits. In some embodiments, layer 20 is a semiconductor substrate on which integrated circuit devices are to be formed. For example, layer 20 may be a silicon substrate, a silicon germanium substrate, a silicon carbon substrate, a III-V compound semiconductor substrate, or the like. In alternative embodiments, layer 20 is a metal layer such as an aluminum copper layer. In yet alternative embodiments, layer 20 is a dielectric layer such as a low-k dielectric layer, an oxide layer, a nitride layer, or the like. In some embodiments, there may be more regions and devices underlying layer 20, which regions and devices are not illustrated.

In some embodiments, hard mask layer 22 and Bottom Anti-Reflective Coating (BARC) 24 are formed over layer 20. The material of hard mask layer 22 is selected, so that hard mask layer 22 is able to sustain the temperature of the subsequent annealing of Bulk Co-Polymer (BCP) coating 32 (FIG. 5) without being deformed or damaged. In accordance with some embodiments, hard mask layer 22 is an inorganic layer, a non-photo-sensitive layer, or the like. For example, hard mask layer 22 may be formed of a nitride, an oxide, an oxynitride, combinations thereof, or multi-layers thereof. In some exemplary embodiments, hard mask layer 22 comprises a silicon nitride layer. In alternative embodiments, hard mask layer 22 comprises a metal hard mask comprising titanium nitride, tantalum nitride, titanium, tantalum, boron nitride, combinations thereof, or multi-layers thereof. Hard mask layer 22 may be formed using a Chemical Vapor Deposition (CVD) method such as Plasma Enhanced CVD (PECVD), Atomic Layer Deposition (ALD), Metal-Organic CVD (MOCVD), or the like. The thickness of hard mask layer 22 may be between about 5 nm and about 100 nm, for example.

BARC 24 may be formed of silicon oxynitride or other applicable materials. In alternative embodiments, BARC 24 may be omitted. In yet other embodiments, additional layers (not shown) such as a PE oxide, an amorphous carbon layer, a nitride layer, or the like, may be formed over hard mask layer 22. Photo sensitive layer 26 is formed over BARC 24, and is then patterned. Photo sensitive layer 26 may be a photo resist, and hence is referred to as photo resist hereinafter. In some embodiments, edges 26A of patterned photo resist 26 are parallel to each other.

Figure 2:
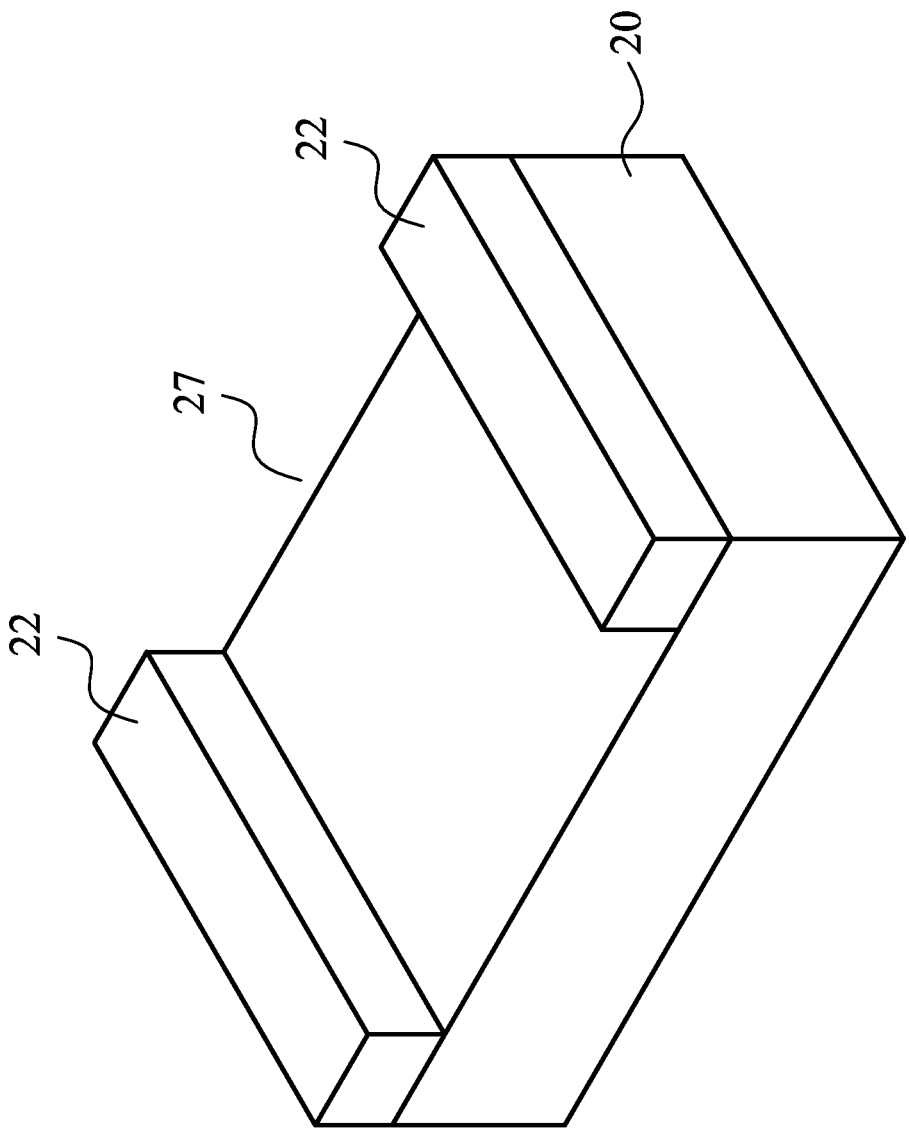

The patterned photo resist 26 is used as an etching mask to etch the underlying BARC 24 and hard mask layer 22. After the etching step, photo resist 26 and BARC 24 are removed, and leaving the patterned hard mask layer 22. The resulting structure is shown in FIG. 2. Through the steps shown in FIGS. 1 and 2, trench 27 is formed in hard mask layer 22.

Figure 3:
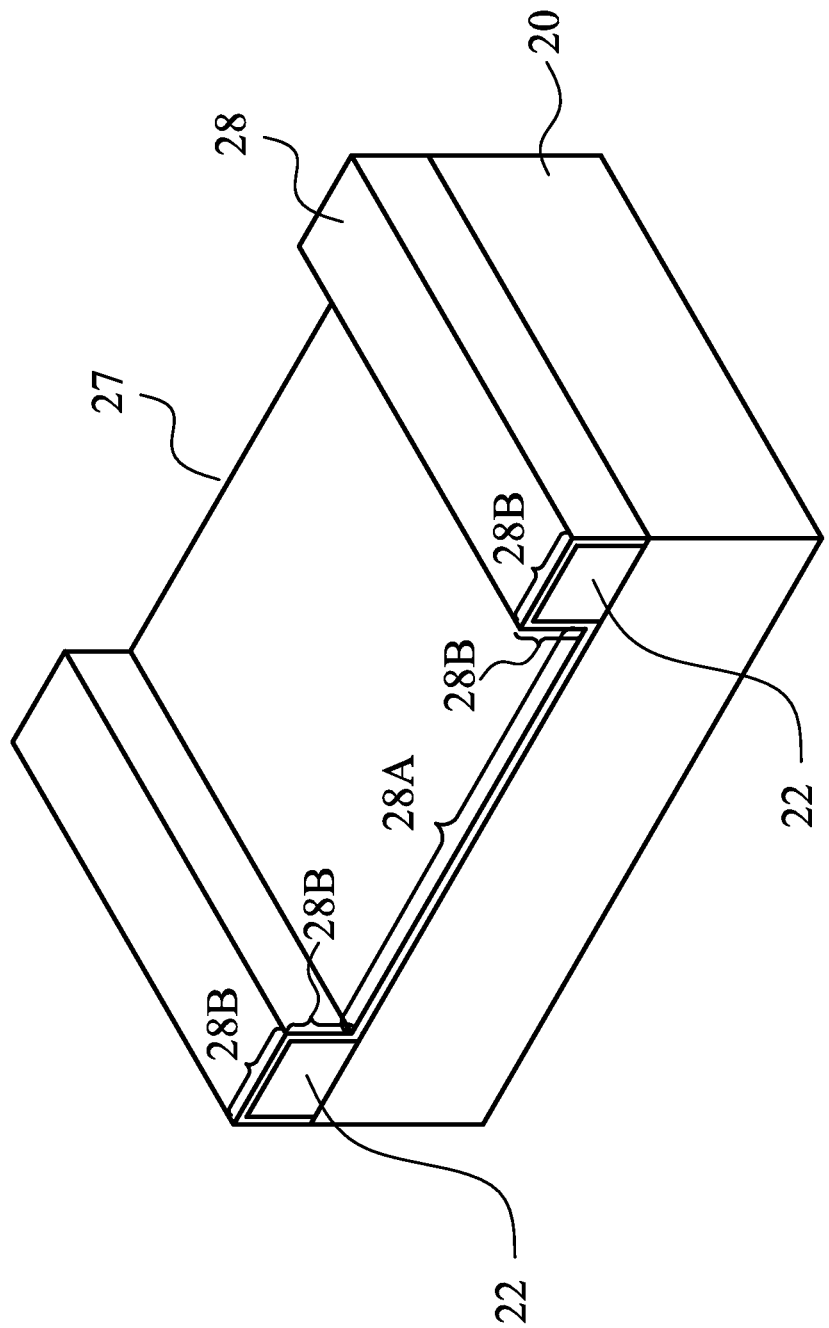
Figure 4:
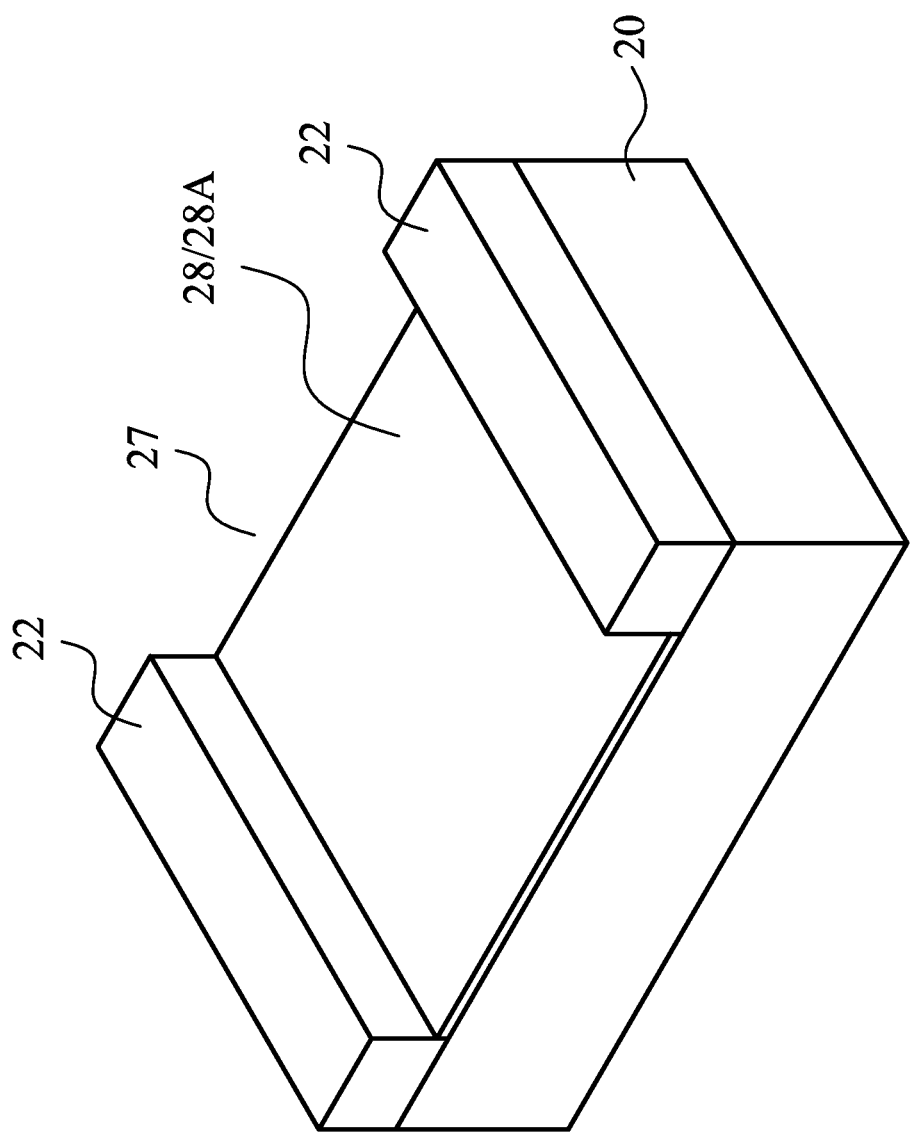

FIGS. 3 and 4 illustrates the formation and the etch back of neutralized layer 28. In FIG. 3, neutralized layer 28 is formed, for example, through spin coating, and hence neutralized layer 28 is filled into trench 27 in hard mask layer 22. Neutralized layer 28 may also comprise first portion 28A at the bottom of trench 27, and second portions 28B on the sidewalls and the top surfaces of hard mask layer 22. In some embodiments, neutralized layer 28 comprises Poly-Styrele (PS) and Poly Methyl Metha Crylate (PMMA). In alternative embodiments, silicon oxide ($SiO_2$) may be used to form neutralized layer 28. In the embodiments $SiO_2$ is used to form neutralized layer 28, neutralized layer 28 may be formed as illustrated in FIGS. 3 and 4, or may be formed over layer 20 before the formation of hard mask layer 22. In the respective embodiments, neutralized layer 28 will comprise a portion exposed through hard mask layer 22, and portions underlying hard mask layer 22 and over layer 20.

In FIG. 4, an etch back is performed on neutralized layer 28, so that second portions 28B of neutralized layer 28 are removed. In the embodiments wherein neutralized layer 28 is formed using spin coating, the first portion 28A, which is at the bottom of trench 27, is thicker than second portions 28B (FIG. 3) of neutralized layer 28. Accordingly, after the etch back, some of the first portion 28A of neutralized layer 28 remains at the bottom of trench 27. In alternative embodiments, the etch back step is not performed, and second portions 28B of neutralized layer 28 remain.

Figure 5:
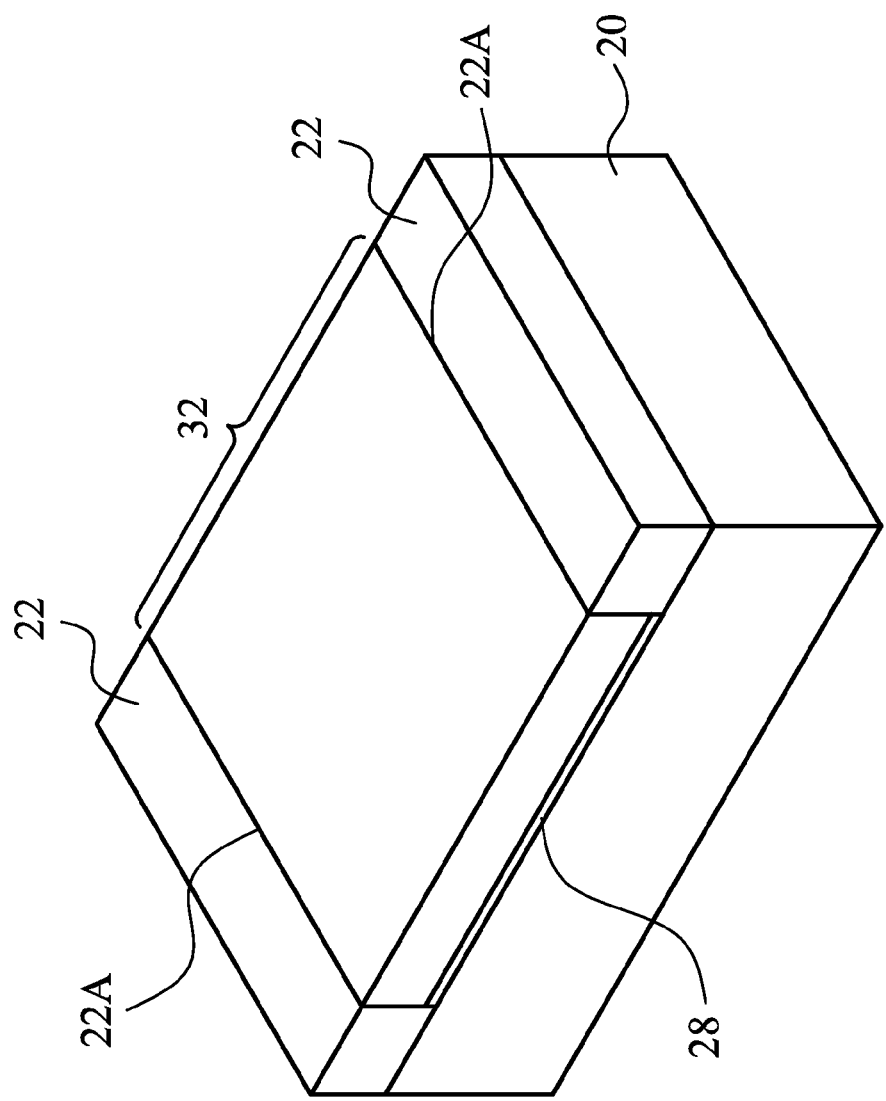
Figure 6:
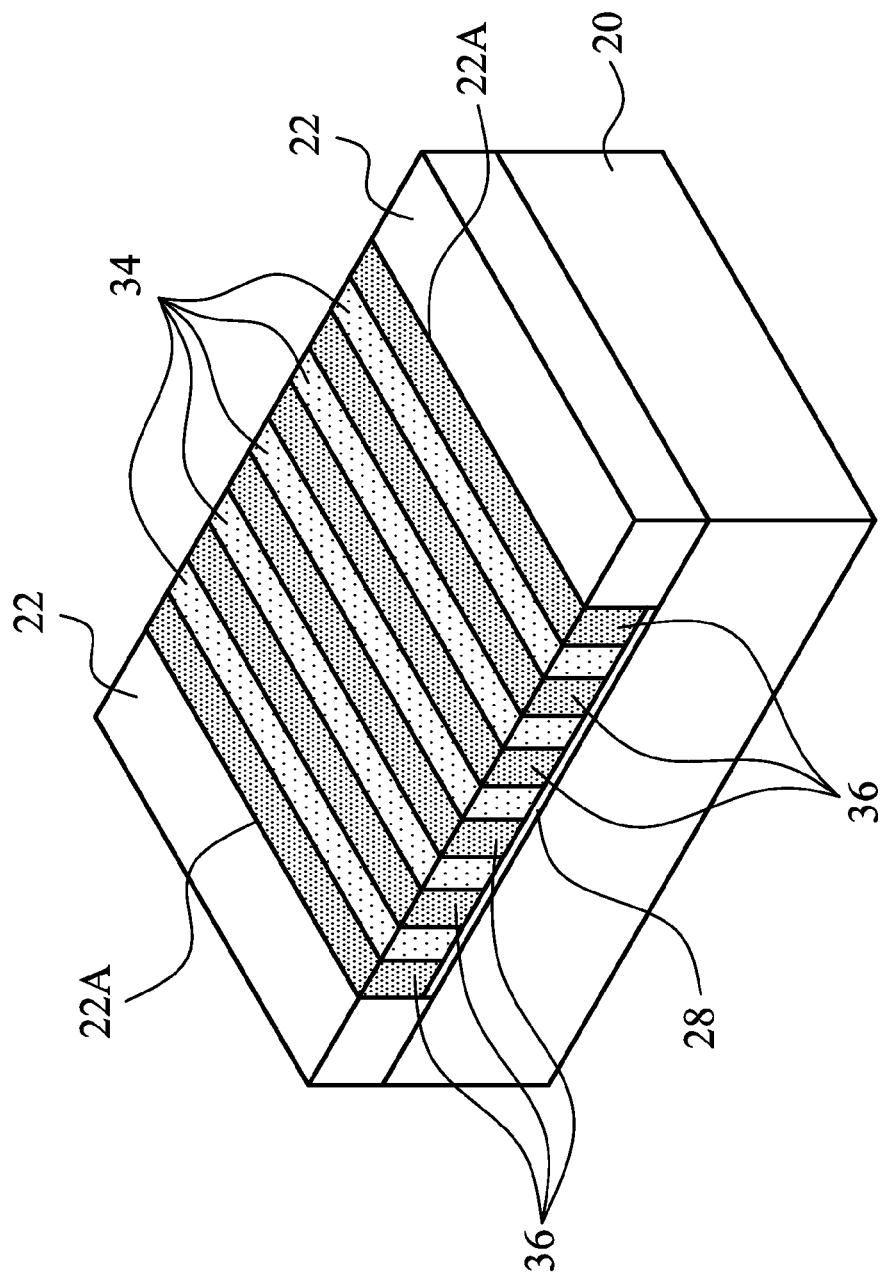
Figure 7:
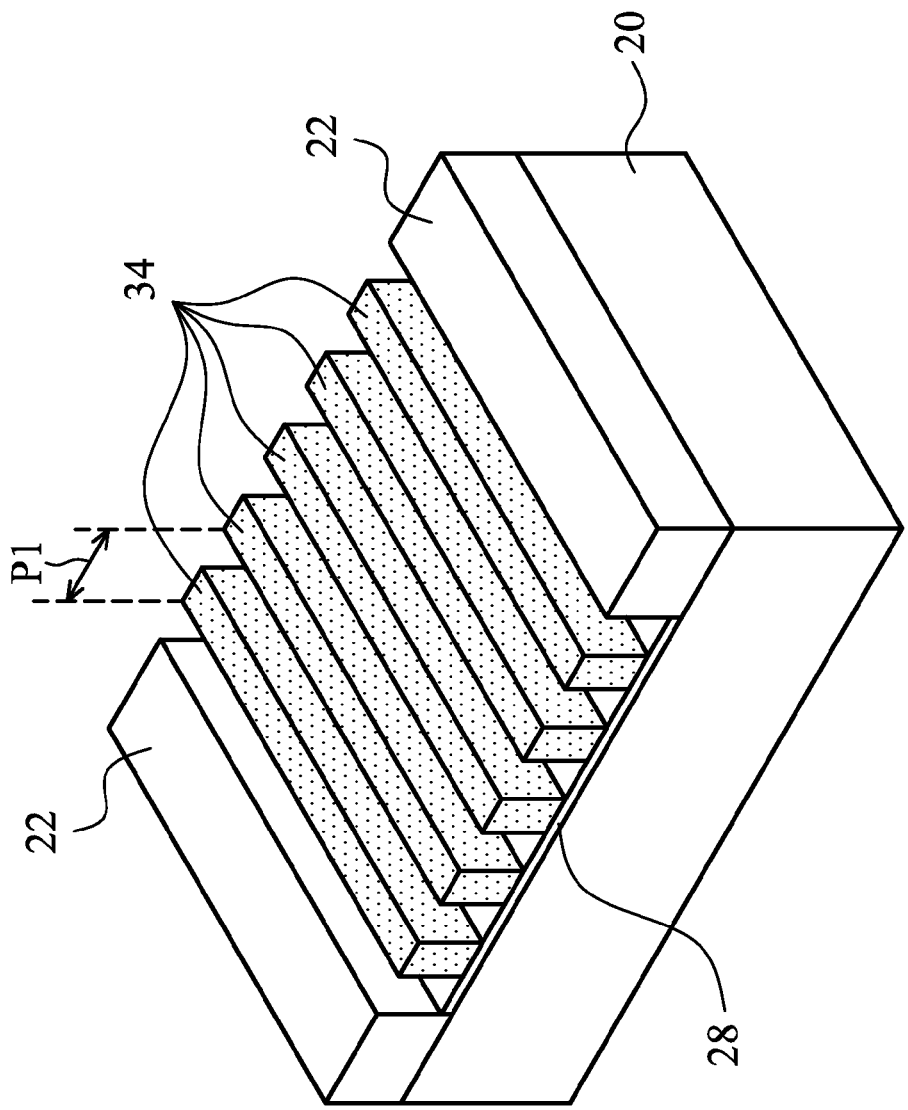

FIGS. 5 through 7 illustrate an exemplary DSA process in accordance with embodiments. FIG. 5 illustrates the dispensing of Bulk Co-Polymer (BCP) coating 32, wherein BCP coating 32 comprises Poly-Styrele (PS) and Poly Methyl Metha Crylate (PMMA). In some embodiments, BCP coating 32 is dispensed using Spin coating. BCP coating 32 fills trench 27, and is confined by the opposite sidewalls 22A of hard mask layer 22. In some embodiments, BCP coating 32 is over and contacting neutralized layer 28. In alternative embodiments, the steps shown in FIGS. 3 and 4 are skipped, and neutralized layer 28 is not formed. Accordingly, BCP coating 32 is over and contacting layer 20.

Next, referring to FIG. 6, an annealing step is performed to anneal BCP coating 32. The annealing may be performed using solvent anneal, for example at room temperature (about 21° C.). Alternatively, the annealing may be performed at between about 25° C. and about 300° C., for example, with an annealing duration between about 0.5 minutes and about 2 hours. As a result of the annealing step, a phase separation occurs in BCP coating 32, and the PS and PMMA are separated into a plurality of strips that have longitudinal directions parallel to edges 22A of hard mask layer 22. In the illustrated embodiments, the PS strips are marked as 34, and the PMMA strips are marked as 36. PS strips 34 and PMMA strips 36 are located in an alternating layout, with each of PS strips 34 being between and adjoining two of PMMA strips 36, and vice versa. Neutralized layer 28, on the other hand, although may also include PS and PMMA, is different from BCP coating 32. Accordingly, in the annealing step, neutralized layer 28 does not incur the phase separation.

PS strips 34 and PMMA strips 36 may have a high etching selectivity. Accordingly, as shown in FIG. 7, PMMA strips 36 are selectively etched, and PS strips 34 remain. The remaining PS strips 34 are spaced apart from each other by the spacing previously occupied by PMMA strips 36. Pitch P1 of PS strips 34 may be between about 5 nm and about 50 nm, for example.

Figure 8:
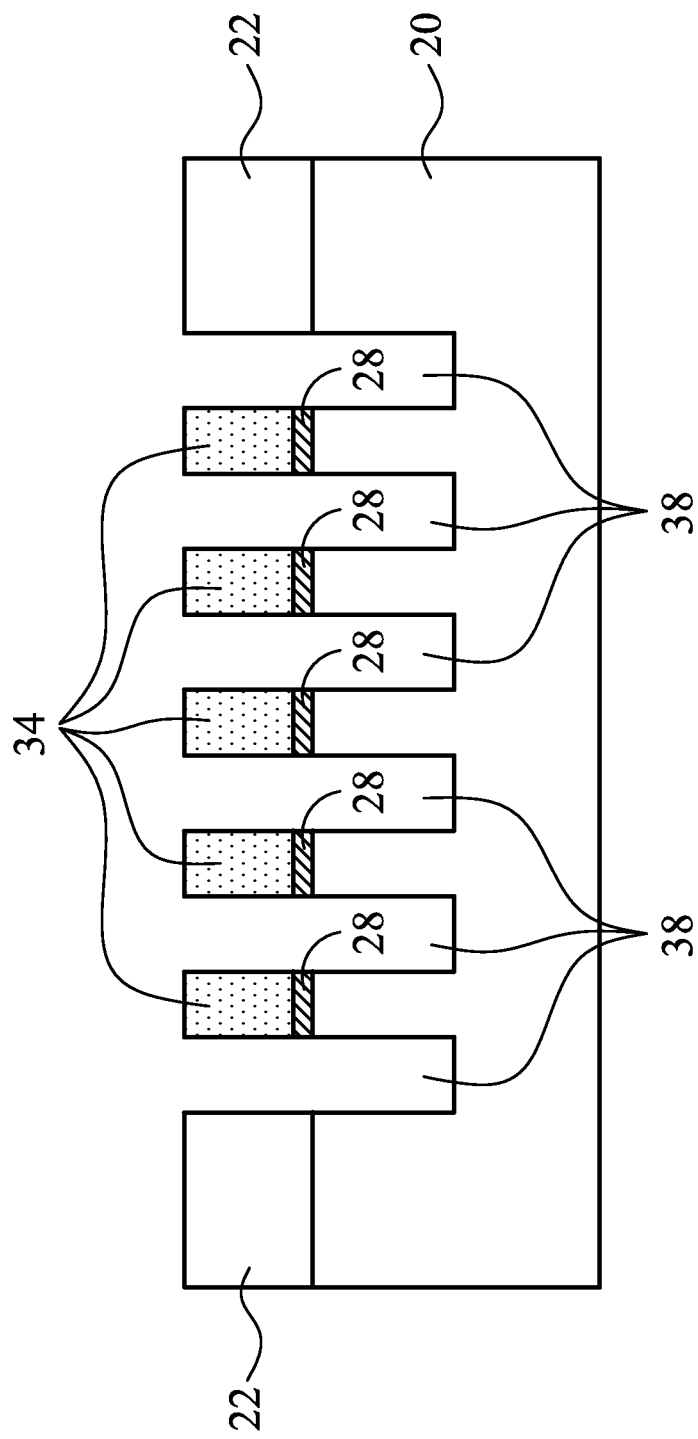

FIG. 8 illustrates the etching of layer 20, wherein PS strips 34 and hard mask layer 22 in combination act as the etching mask. In the etching step, the portions of layer 20 that are not covered by PS strips 34 and hard mask layer 22 are etched. The portions of neutralized layer 28 that are exposed through neighboring PS strips 34 are also etched. Openings 38 are formed in layer 20. In the illustrated embodiments, openings 38 extend to an intermediate level of layer 20. In alternative embodiments, openings 38 penetrate through layer 20. In FIG. 9, PS strips 34 and neutralized layer 28 are removed. Hard mask layer may remain un-removed, or may be removed as in FIG. 9.

In the conventional DSA process, a photo resist is used to confine the respective BCP coating in order to guide the direction of the separated PS and PMMA during the annealing step. In the annealing of the BCP coating, however, the photo resist is adversely affected by the high temperature adopted in the annealing step. For example, under the high temperature of the annealing step, the photo resist may have a footing problem. Furthermore, due to the high temperature of the annealing, the pitch of PS strips 34 is limited due to the adverse profile of the photo resist. In the embodiments, however, hard mask layer 22 is used to guide the direction of the PS-PMMA strips. Since hard mask layer 22 is not affected by the high temperature of the annealing step, the adverse effect caused by the annealing of the BCP coating is substantially eliminated.

In accordance with embodiments, a method includes forming a patterned hard mask layer, with a trench formed in the patterned hard mask layer. A BCP coating is dispensed in the trench, wherein the BCP coating includes PS and PMMA. An annealing is performed on the BCP coating to form a plurality of PS strips and a plurality of PMMA strips allocated in an alternating layout. The PMMA strips are selectively etched, with the PS strips left in the trench.

In accordance with other embodiments, a method includes forming a hard mask layer, forming and patterning a photo resist over the hard mask layer, patterning the hard mask layer to form a trench in the hard mask layer using the photo resist as an etching mask, and removing the photo resist. A BCP coating is dispensed in the trench, wherein the BCP coating includes PS and PMMA. An annealing is performed on the BCP coating to form a plurality of PS strips and a plurality of PMMA strips out of the BCP coating, with the plurality of PS strips and the plurality of PMMA strips located in an alternating layout. The PMMA strips are selectively etched, with the PS strips left in the trench. The method further includes using the PS strips and the hard mask layer as an etching mask to etch a layer underlying the PS strips and the hard mask layer.

In accordance with yet other embodiments, a method includes forming a non-photo-sensitive layer over an underlying layer, patterning the non-photo-sensitive layer to form a trench, dispensing a BCP coating into the trench, and performing an annealing on the BCP coating to separate the BCP coating into a first and a second plurality of strips. The first and the second plurality of strips have different compositions, and are located in an alternating layout. The method further includes selectively etching the first plurality of strips, with the second plurality of strips left in the trench, etching the underlying layer using the second plurality of strips and the non-photo-sensitive layer as an etching mask, and after the underlying layer is etched, removing the second plurality of strips and the non-photo-sensitive layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a patterned hard mask layer, with a trench formed in the patterned hard mask layer;
    forming a neutralized layer at a bottom of the trench;
    dispensing a Bulk Co-Polymer (BCP) coating in the trench, with the BCP being over the neutralized layer, wherein the BCP coating comprises Poly-Styrele (PS) and Poly Methyl Metha Crylate (PMMA);
    performing an annealing on the BCP coating to form a plurality of PS strips and a plurality of PMMA strips allocated in an alternating layout; and
    selectively etching the PMMA strips, with the PS strips left in the trench.

2. The method of claim 1 further comprising using the PS strips and the hard mask layer in combination as an etching mask to etch a layer underlying the PS strips and the patterned hard mask layer.

3. The method of claim 1, wherein the step of forming the patterned hard mask layer comprises forming an inorganic layer.

4. The method of claim 3, wherein the step of forming the hard mask layer comprises forming a nitride layer.

5. The method of claim 1, wherein the neutralized layer comprises a first portion at a bottom of the trench, and second portions on sidewalls and top surfaces of the hard mask layer, and wherein the method further comprises, before the step of dispensing the BCP coating, removing the second portions of the neutralized layer.

6. The method of claim 5, wherein the forming the neutralized layer comprises spin coating, and wherein the removing the second portions of the neutralized layer comprises etching back the first portion and the second portions of the neutralized layer simultaneously.

7. The method of claim 1, wherein the step of forming the patterned hard mask layer comprises:
    forming a hard mask layer;
    forming a patterned photo resist over the hard mask layer;
    etching the hard mask layer to form the patterned hard mask layer, wherein the patterned photo resist is used as an etching mask; and
    before the dispensing and the annealing, removing and the patterned photo resist.

8. The method of claim 7 further comprising:
    before the step of forming the patterned photo resist, forming a Bottom Anti-Reflective Coating (BARC) over the hard mask layer, wherein the patterned photo resist is over the BARC; and
    before the dispensing and the annealing, removing the BARC.

9. A method comprising:
    forming a hard mask layer;
    forming and patterning a photo resist over the hard mask layer;
    patterning the hard mask layer to form a trench in the hard mask layer using the photo resist as an etching mask;
    removing the photo resist;
    forming a neutralized layer at a bottom of the trench, with the BCP coating over and contacting the neutralized layer;
    dispensing a Bulk Co-Polymer (BCP) coating in the trench and over the neutralized layer, wherein the BCP coating comprises Poly-Styrele (PS) and Poly Methyl Metha Crylate (PMMA);
    performing an annealing on the BCP coating to form a plurality of PS strips and a plurality of PMMA strips out of the BCP coating, with the plurality of PS strips and the plurality of PMMA strips located alternatingly;
    selectively etching the PMMA strips, with the PS strips left in the trench; and
    using the PS strips and the hard mask layer as an etching mask to etch a layer underlying the PS strips and the hard mask layer.

10. The method of claim 9 further comprising, after the layer underlying the PS strips and the hard mask layer is etched, removing the PS strips and the hard mask layer.

11. The method of claim 9, wherein the step of forming the hard mask layer comprises forming an inorganic material.

12. The method of claim 11, wherein the step of forming the hard mask layer comprises forming a nitride layer.

13. The method of claim 9, wherein the hard mask layer comprises sidewalls in the trench, and wherein the neutralized layer comprises a portion at a bottom of the trench, with the BCP coating in physical contact with lower portions of the sidewalls of the hard mask layer, and with upper portions of the sidewalls of the hard mask layer being exposed to the trench.

14. The method of claim 9, wherein the neutralized layer comprises a first portion at a bottom of the trench, and second portions on sidewalls and top surfaces of the hard mask layer, and wherein the method further comprises, before the step of dispensing the BCP coating, removing the second portions of the neutralized layer.

15. The method of claim 9 further comprising:
    forming a Bottom Anti-Reflective Coating (BARC) over the hard mask layer, wherein the photo resist is formed over the BARC; and
    before the step of dispensing the BCP coating, removing the BARC.

16. A method comprising:
    forming a non-photo-sensitive layer over an underlying layer;
    patterning the non-photo-sensitive layer to form a trench, with remaining portions of the non-photo-sensitive layer on opposite sides of the trench;
    forming a neutralized layer comprising a first portion at a bottom of the trench, and second portions on sidewalls and top surfaces of the remaining portions of the non-photo-sensitive layer;
    etching back the first portion and the second portions of the neutralized layer to remove the second portions and to thin the first portion of the neutralized layer;
    dispensing a Bulk Co-Polymer (BCP) coating into the trench, with the BCP coating being over the first portion of the neutralized layer;
    performing an annealing on the BCP coating to separate the BCP coating into a first and a second plurality of strips, wherein the first and the second plurality of strips have different compositions, and are located in an alternating layout;
    selectively etching the first plurality of strips, with the second plurality of strips left in the trench;
    etching the neutralized layer and the underlying layer using the second plurality of strips and the non-photo-sensitive layer as an etching mask; and
    after the underlying layer is etched, removing the second plurality of strips and the non-photo-sensitive layer.

17. The method of claim 16, wherein after the annealing, the BCP coating is separated into Poly-Styrele (PS) strips as the first plurality of strips and Poly Methyl Metha Crylate (PMMA) strips as the second plurality of strips.

18. The method of claim 16, wherein the step of forming the non-photo-sensitive layer comprises:
    forming a blanket non-photo-sensitive layer;
    forming a patterned photo resist over the blanket non-photo-sensitive layer;
    etching the blanket non-photo-sensitive layer using the patterned photo resist as an etching mask to form the non-photo-sensitive layer; and
    before the dispensing and the annealing, removing and the photo resist.

19. The method of claim 16, wherein the step of forming the non-photo-sensitive layer comprises forming a nitride layer.

20. The method of claim 16, wherein the neutralized layer comprises a homogenous material.

* * * * *